US006730603B2

(12) United States Patent
Crevasse et al.

(10) Patent No.: US 6,730,603 B2
(45) Date of Patent: May 4, 2004

(54) SYSTEM AND METHOD OF DETERMINING A POLISHING ENDPOINT BY MONITORING SIGNAL INTENSITY

(75) Inventors: Annette M. Crevasse, Apopka, FL (US); William G. Easter, Orlando, FL (US); Frank Miceli, Orlando, FL (US); Yifeng Winston Yang, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/061,542

(22) Filed: Oct. 25, 2001

(65) Prior Publication Data

US 2003/0082844 A1 May 1, 2003

(51) Int. Cl.[7] .............................................. H01L 21/302
(52) U.S. Cl. .................... 438/691; 438/692; 438/438; 438/693; 438/697; 438/699
(58) Field of Search ................................ 438/691, 692, 438/693, 697, 699

(56) References Cited

U.S. PATENT DOCUMENTS

| 5,240,552 | A | | 8/1993 | Yu et al. | |
|---|---|---|---|---|---|
| 6,028,669 | A | * | 2/2000 | Tzeng | ........................ 356/504 |
| 6,524,959 | B1 | * | 2/2003 | Lu et al. | ..................... 438/690 |
| 6,537,133 | B1 | * | 3/2003 | Birang et al. | .................. 451/6 |

* cited by examiner

Primary Examiner—Robert Kunemund
Assistant Examiner—Binh X. Tran

(57) ABSTRACT

The present invention provides a polishing endpoint detection system, for use with a polishing apparatus, a method of determining a polishing endpoint of a surface located on a semiconductor wafer, and a method of manufacturing an integrated circuit on a semiconductor wafer. In one embodiment, the polishing endpoint detection system includes a carrier head having a polishing platen associated therewith. Also, the detection system includes a signal emitter located adjacent one of the carrier head or polishing platen. The signal emitter is configured to generate an emitted signal capable of traveling through an object to be polished. In addition, the detection system includes a signal receiver located adjacent another of the carrier head or polishing platen. The signal receiver is configured to receive the emitted signal from which a change in a signal intensity of the emitted signal can be determined.

14 Claims, 3 Drawing Sheets

SYSTEM AND METHOD OF DETERMINING A POLISHING ENDPOINT BY MONITORING SIGNAL INTENSITY

TECHNICAL FIELD OF THE INVENTION

The present invention is directed, in general, to polishing of semiconductor wafers and, more specifically, to a system and method of determining a polishing endpoint by monitoring signal intensity during a polishing process.

BACKGROUND OF THE INVENTION

In the fabrication of semiconductor components, metal conductor lines are formed over a substrate containing device circuitry. The metal conductor lines serve to interconnect discrete devices, and thus form integrated circuits (ICs). The metal conductor lines are further insulated from the next interconnection level by thin films of insulating material deposited by, for example, Chemical Vapor Deposition (CVD) of oxide or application of Spin On Glass (SOG) layers followed by fellow processes. Holes, or vias, formed through the insulating layers provide electrical connectivity between successive conductive interconnection layers. In such wiring processes, it is desirable that the insulating layers have a smooth surface topography, since it is difficult to lithographically image and pattern layers applied to rough surfaces.

Also, deep (greater than 3 $\mu$m) and narrow (less than 2 $\mu$m) trench structures have been used in advanced semiconductor design for three major purposes: (1) to prevent latch-up and to isolate n-channel from p-channel devices in CMOS circuits; (2) to isolate the transistors of bipolar circuits; and (3) to serve as storage-capacitor structures in DRAMS. However, in this technology it is even more crucial to precisely determine the endpoint of differing materials to prevent unnecessary dishing out of the connector metal.

Chemical-mechanical polishing (CMP) has been developed for providing smooth insulator topographies. Briefly, the CMP processes involve holding and rotating a thin, reasonably flat semiconductor wafer against a wetted polishing surface under controlled chemical, pressure, and temperature conditions. A chemical slurry containing a polishing agent, such as alumina or silica, is used as the abrasive material. Additionally, the chemical slurry contains selected chemicals that etch or oxidize various surfaces of the wafer during processing. The combination of mechanical and chemical removal of material during polishing results in superior planarity of the polished surface.

CMP is also used to remove different layers of material from the surface of a semiconductor wafer. For example, following via formation in a dielectric material layer, a metallization layer is blanket-deposited, and then CMP is used to produce planar metal studs. When used for this purpose, it is important to remove a sufficient amount of material to provide a smooth surface, without removing an excessive amount of underlying materials. The accurate removal of material is particularly important in today's submicron technologies where the layers between device and metal levels are constantly getting thinner. To better determine endpoints between removed and remaining layers of a semiconductor wafer, an accurate polishing endpoint detection technique is invaluable.

In the past, endpoints have been detected by interrupting the CMP process, removing the wafer from the polishing apparatus, and physically examining the wafer surface by techniques that ascertain film thickness and/or surface topography. However, with such prior art processes if the wafer did not meet specifications, it was loaded back into the polishing apparatus for further polishing to achieve the desired planarity. This would have to be repeated until a sufficient amount of material was removed. Unfortunately, in addition to the excess time required by this technique, if too much material was removed, the wafer was likely found to be substandard to the required specifications, and often discarded altogether. By experience, an elapsed CMP time for a given CMP process has been developed with some accuracy. However, like the prior art technique just mentioned, this endpoint detection technique is time consuming, unreliable, and costly.

Various active processes have been developed to circumvent the problems associated with prior art endpoint detection techniques. However, these active processes suffer from their own disadvantages and inaccuracies. One of the better known of these prior art techniques involves the continuous monitoring of the motor current of the CMP apparatus. Specifically, the drive motor used to rotate the platen holding the polishing pad is continuously monitored during the polishing process for changes in load current. As each layer of a semiconductor wafer is polished, a certain amount of friction develops between the polishing pad and differing wafer layers. When the CMP process finishes the removal of one layer of the wafer and begins on the next, a change in the amount of friction between the polishing pad and wafer layer affects the amount of work required by the drive motor. As the work required by the drive motor changes with each different layer, the load current of the motor changes as well. These changes in load current may be monitored to determine when the polishing process has begun on a new wafer layer.

Unfortunately, this technique is typically successful for detecting the endpoint of only metal layers, and has proven inaccurate for use with dielectric and other non-metal layers. Other factors, including the various slurries that may be used depending on the desired result, may affect the current of the drive motor, leading to inaccurate results. Also, changes in load current caused by a power surge may incorrectly inform the operator that an endpoint of a particular layer of the wafer has been reached.

Another common technique found in the prior art is optical endpoint detection. In this technique, a laser, mounted in the platen, is transmitted through a window in the polishing pad and contacts the layer on the wafer currently being polished. A change in layer material may be detected by the laser to determine an endpoint of a particular layer. However, this technique may also be deficient in that problems with the window in the polishing pad can lead to inaccurate results. For instance, leakage of slurry, or even water, onto the window may distort the laser beam and detrimentally affect detection. Also, damage to the window, perhaps from a manufacturing defect or even caused by an operator mounting the polishing pad, may also prevent or alter endpoint detection. Even if the window is not affected, those skilled in the art understand the excess cost associated with such specialized polishing pads.

Still other techniques for endpoint detection found in the prior art include those techniques that bounce an acoustic signal off of the wafer layers being polished, similar to sonar principles. However, these prior art detection techniques are based on the time (or speed) of a round trip of the acoustic waves directed to, and reflected back from, the wafer layers. Unfortunately, if such techniques were employed during a polishing operation, when endpoint detection would be most beneficial, excess layer thickness may be removed while waiting to measure the time of a return trip of the waves from the layer. Such a deficiency may become even more critical when only a small thickness, for example, a few microns, needs to be polished from the wafer 120. Those skilled in the art understand that over-polishing a wafer layer by just a few microns may render dies in the wafer, or perhaps the entire wafer, unusable. With the high costs of semiconductor materials in today's competitive semiconductor market, manufacturers are understandably eager to avoid wasting product.

Thus, a more reliable and accurate technique for determining a polishing endpoint, with less risk than those found in the prior art, is desirable. Accordingly, what is needed in the art is an improved technique for accurately determining the endpoint of one semiconductor wafer layer and the beginning of the next during a polishing process that does not suffer from the deficiencies of the techniques found in the prior art.

SUMMARY OF THE INVENTION

To address the above-discussed deficiencies of the prior art, the present invention provides a polishing endpoint detection system, for use with a polishing apparatus. In one embodiment, the polishing endpoint detection system includes a carrier head having a polishing platen associated therewith. Also, the detection system includes a signal emitter located adjacent one of the carrier head or polishing platen. The signal emitter is configured to generate an emitted signal capable of traveling through an object to be polished. In addition, the detection system includes a signal receiver located adjacent another of the carrier head or polishing platen. The signal receiver is configured to receive the emitted signal from which a change in a signal intensity of the emitted signal can be determined.

In another aspect, the present invention provides a method of determining a polishing endpoint of a surface located on a semiconductor wafer. In one embodiment, the method includes emitting a first signal from an emitter located adjacent one of a carrier head or a polishing platen. The method further includes causing the signal to pass through a polished film located on a semiconductor wafer, and thereby provide a second signal having a signal intensity less than a signal intensity of the first signal. The method also includes receiving the second signal emanating from the film with a receiver located adjacent another of the carrier head or the polishing platen. The method then includes determining a polishing endpoint for the film as a function of a change of intensity between the first and second signals.

In yet another aspect, the present invention provides a method of manufacturing an integrated circuit. In one embodiment, the method includes forming an integrated circuit layer on a semiconductor wafer. The integrated circuit layer is polished with a polishing apparatus having a carrier head and a polishing platen associated therewith. The method further includes determining a polishing endpoint of the integrated circuit layer by emitting a first signal from an emitter located adjacent one of the carrier head or the polishing platen and causing the first signal to pass through the integrated circuit layer. A second signal is thereby provided having a signal intensity less than a signal intensity of the first signal. The method includes receiving the second signal emanating from the integrated circuit layer with a receiver located adjacent another of the carrier head or the polishing platen. The method still further includes determining the polishing endpoint as a function of a change of intensity between the first and second signals.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
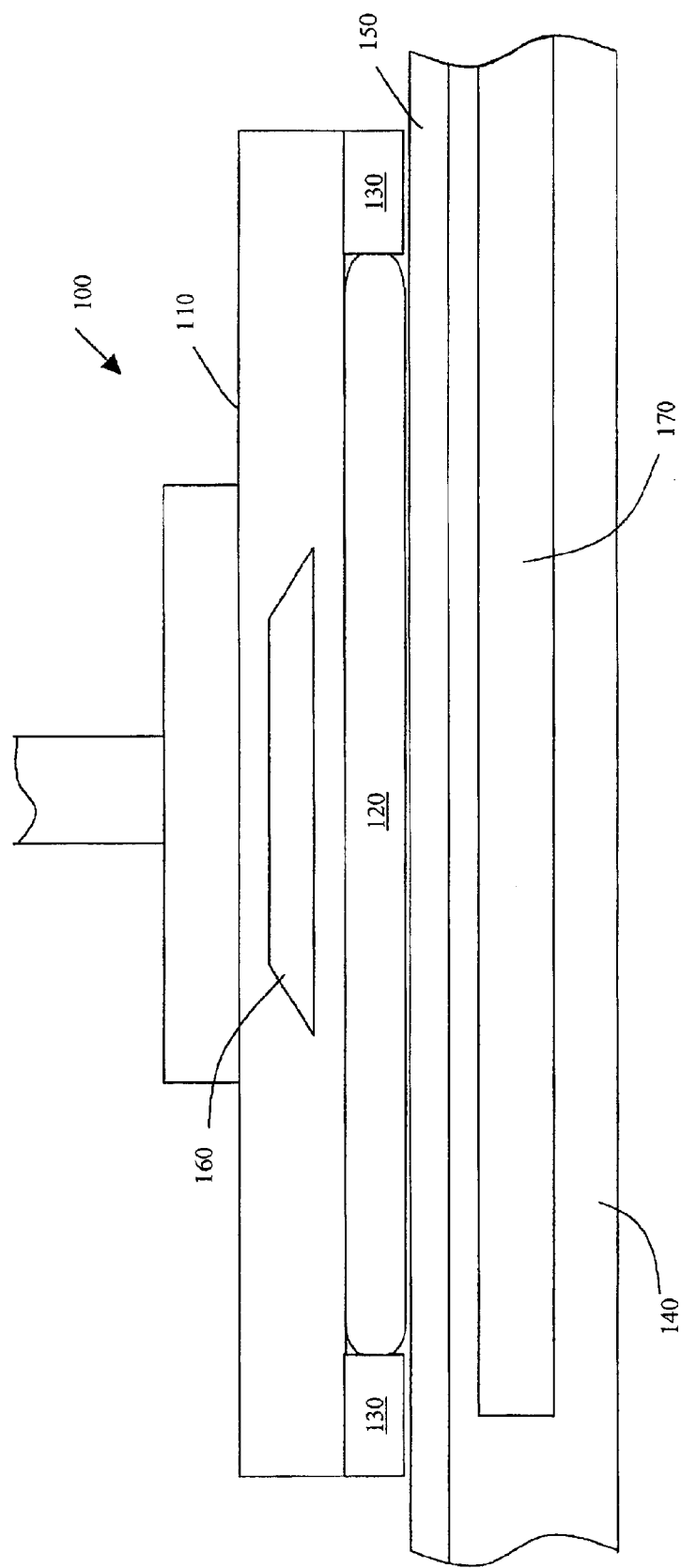
FIG. 1 illustrates one embodiment of a polishing endpoint detection system constructed according to the principles of the present invention.

Referring initially to FIG. 1, illustrated is one embodiment of a polishing endpoint detection system 100 constructed according to the principles of the present invention. As shown, the system 100 includes a carrier head 110 for mounting a semiconductor wafer 120. A retaining ring 130 surrounds the wafer 120 and keeps it in position during a polishing operation. The system 100 further includes a polishing platen 140. The polishing platen 140 includes a polishing pad 150 mounted thereon for polishing layers (not shown) located on the wafer 120 in accordance with conventional practice. Typically, the polishing pad 150 is comprised of conventional materials, such as polyurethane. However, any suitable material may be used.

Located within the carrier head 110 is a signal emitter 160 constructed according to the present invention. As shown, the emitter 160 has a smaller diameter than a diameter of the wafer 120. As such, the system 100 is used for taking measurements of a center portion of the wafer 120. Of course, the present invention is not so limited. In accordance with the principles described herein, the emitter 160 generates and transmits a signal, which passes through the layers of the wafer 120 and is received by a receiver 170. In the illustrated embodiment, the receiver 170 is located within the polishing platen 140, however the present invention is not so limited. In other embodiments, the receiver 170 may be positioned between the polishing platen 140 and the polishing pad 150. Of course, when the emitter 160 is located adjacent the carrier head 110, other locations for the receiver 170 adjacent the polishing platen 140 are well within the scope of the present invention. In addition, in some embodiments, the emitter 160 is located adjacent the polishing platen 140, while the receiver 170 is located adjacent the carrier head 110.

In an advantageous embodiment of the present invention, the emitted signal is an acoustic wave having a signal intensity. Although the following disclosure discusses the present invention in terms of acoustic waves, other signals having a measurable level of intensity, and that are capable of traveling through a solid material, are also within the scope of the present invention. An intensity, or strength, of the acoustic waves generated by the emitter 160, as they pass through the layers of the wafer 120 and are received by the receiver 170, will vary based on, for instance, the thickness of the layers of the wafer 120. In addition, the density of the particular material comprising the layers will also affect signal intensity. In one embodiment of the endpoint detection system 100, a signal intensity may first be measured by transmitting acoustic signals through the layers of the wafer 120 before the polishing operation begins. This initial measure of signal intensity may be used as a baseline measurement for comparison with a signal intensity measurement made during polishing of the wafer 120. Thus, an instantaneous intensity measurement may be taken during the polishing operation to detect an endpoint of a layer of the wafer 120 based on a comparison with the original ("baseline") intensity measurement and second intensity measurement taken of the acoustic waves emanating from the layers of the wafer 120. By measuring a signal intensity of the acoustic waves in accordance with the present invention, a single measurement (for comparison against the baseline intensity measurement) may be taken during polishing of the wafer 120, without disrupting the polishing process.

In an advantageous embodiment, a chart or table may be developed before polishing begins setting forth various known intensities for acoustic waves traveling through various materials, and varying thicknesses thereof, that may comprise the layers of the wafer 120 for a specific frequency of acoustic waves. A table with such various intensities provide a reference for real-time comparison with signal intensity measurements taken during the polishing process. By taking a single measurement of the intensity of the waves as they pass in one direction through layers of the wafer 120, higher efficiency and accuracy in thickness determination is achieved since the measurement is not based upon a round-trip travel time of the waves. The problems associated with prior art techniques based upon the round trip times of signals are discussed in detail above, and the system 100 of the present invention may be employed to overcome these deficiencies.

In an exemplary embodiment, the emitter 160 generates and transmits ultrasonic acoustic waves. In such an embodiment, the ultrasonic waves are not audible by operators, and are thus less distracting for the surrounding environment of the system 100. In an alternative embodiment, the emitter 160 may be configured to generate acoustic waves at multiple frequencies, in turn. By performing several signal intensity measurements using the various frequencies (one measurement at each frequency), the system 100 of the present invention may provide even further accuracy in the detection of layer endpoints. Those skilled in the art understand the accuracy achievable with multiple frequency measurements as evidenced, for example, with a fully functional optical endpoint detection system. Of course, since the system 100 of the present invention does not require a window in the polishing pad 150, it does not suffer from the same deficiencies of such optical systems.

Preferably, the frequency of the acoustic waves generated by the emitter 160 are different from the acoustic frequencies generated by other tools surrounding and used in conjunction with the system 100. For instance, motors used within or around the system 100 may generate audible or inaudible acoustic waves having frequencies caused by friction or even electromagnetic fields. So as to prevent interference with the endpoint detection measurements taken by the system 100, the frequency of the acoustic waves generated by the emitter 160 should differ from those of any surrounding acoustic waves, regardless of origin. Alternatively, however, the surrounding acoustic waves may be filtered out as background noise.

In addition to endpoint detection, the system 100 of the present invention may also be employed to detect a temperature of the interface between the polishing pad 150 and the wafer 120 layer being polished. As friction increases or decreases at this interface, so too does the temperature. Changes in temperature of an object directly affect the intensity or strength with which signals may pass through that object. In view of this realization, measurements made by the system 100 of the present invention may be used to determine the temperature of the layer being polished. Those skilled in the art understand that monitoring the temperature of the interface between the layer being polished and the polishing pad 150 may prevent damage to die formed on the wafer 120 from excess temperatures. Moreover, changes in temperature during the polishing process affect removal rates. In turn, such changes in removal rate may affect overall process stability, which may result in scrap wafers.

Figure 2:
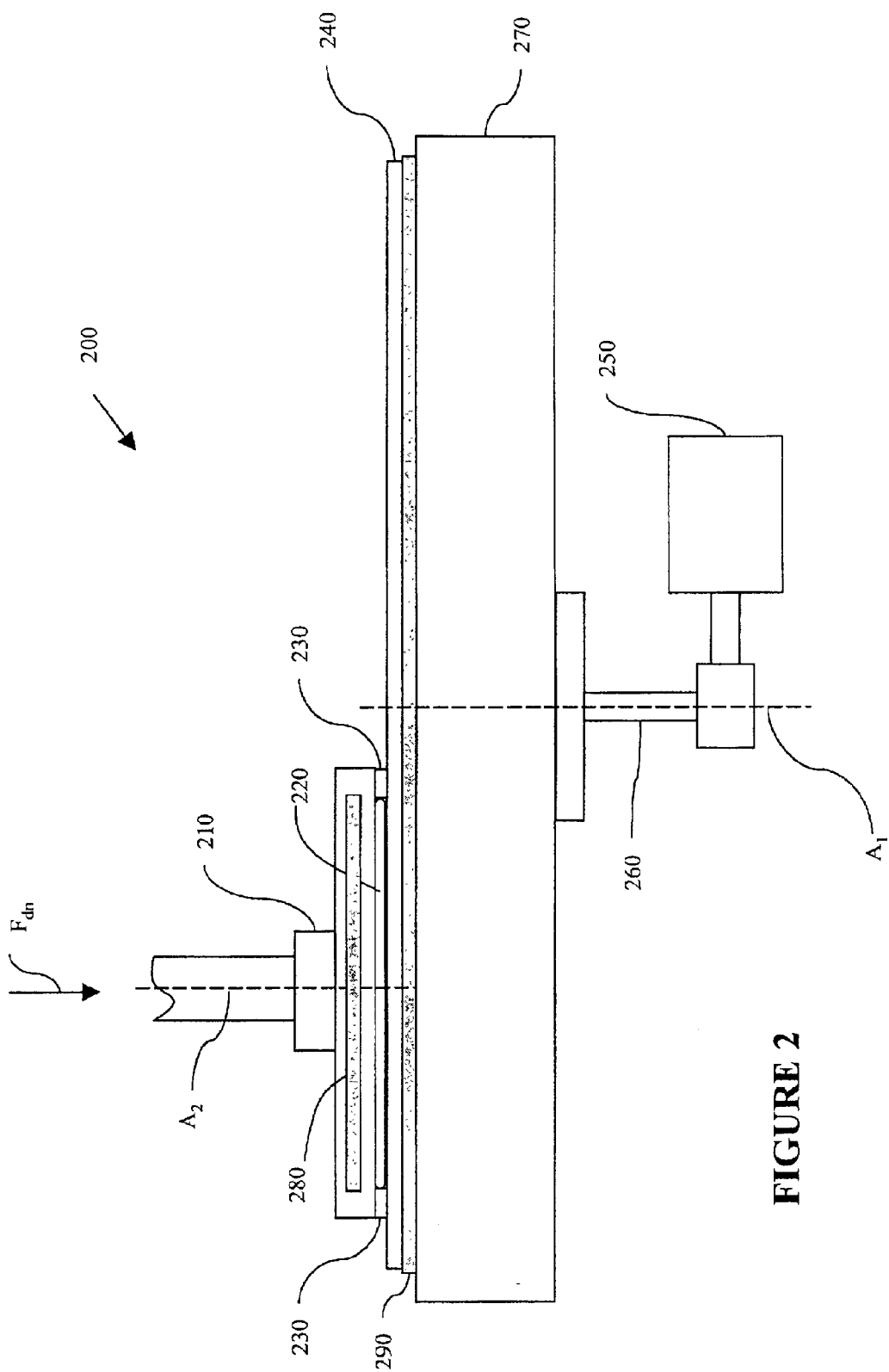
FIG. 2 illustrates a chemical-mechanical polishing apparatus incorporating another embodiment of a polishing endpoint detection system of the present invention.

Looking now at FIG. 2, illustrated is a semiconductor wafer CMP polishing apparatus 200 incorporating another embodiment of a polishing endpoint detection system constructed according to the present invention. As with the system 100 in FIG. 1, the polishing apparatus 200 includes a carrier head 210 having a wafer 220 mounted thereon. Surrounding the wafer 220 is a retaining ring 230, for holding the wafer 220 in place. During the polishing process, a downward force $F_{dn}$ is applied to the carrier head 210, causing the carrier head 210 to press the wafer 220 against a polishing pad 240 to polish a layer of the wafer 220 as needed.

The polishing apparatus 200 further includes a drive motor 250 coupled to a drive shaft 260. The drive shaft 260, in turn, is coupled to a polishing platen 270. During a polishing operation, such as a CMP process, the drive motor 250 is used to turn the drive shaft 260, thereby rotating the polishing platen 270, and thus the polishing pad 240, about a first axis $A_1$. Optionally, the carrier head 210 may also be rotated during the polishing operation about a second axis $A_2$.

In accordance with the principles described herein, a receiver 280 is located in the carrier head 210 for use in acoustically detecting endpoints during the polishing operation. In the illustrated embodiment, the receiver 280 has a size substantially equal to the wafer 220. As such, the receiver 280 may be used to take measurements across the entire diameter of the wafer 220. Also illustrated in this embodiment is an emitter 290. The emitter 290 is located adjacent the polishing platen 270, positioned between the polishing pad 240 and the polishing platen 270. In one embodiment, the emitter 290 may be substantially the same diameter as the polishing platen 270. In other embodiments, however, the emitter 290 may have an annular shape, having a width substantially equal to a diameter of the wafer 220. In such an embodiment, the annular shape of the emitter 290 substantially defines an orbital rotation of the carrier head 210 as it moves the wafer 220 along the polishing platen 270.

The emitter 290 emits signals towards the receiver 280, which are received by the receiver 280 and measured for signal intensity. In this advantageous embodiment, by locating the emitter 290 in this position (or the receiver 280, if desired, by transposing position of the receiver 280 and emitter 290), a conventional polishing pad 240 and polishing platen 270 may be employed while retaining the benefits associated with the present invention. Those skilled in the art understand the cost savings attainable by incorporating non-specialized components into a CMP polishing apparatus.

By providing an endpoint detection system that detects an endpoint by generating and receiving signals, such as acoustic waves, the present invention provides several benefits over the prior art. For instance, the present invention provides for endpoint detection of both metal and non-metal wafer layers, which may not be possible with conventional techniques found in the art. Those skilled in the art understand that the capability of detecting an endpoint for all types of materials allows for a more efficient and desirable endpoint detection system. In addition, since emitters and receivers of a detection system of the present invention may be isolated from both slurry and polishing debris, conventional polishing platens and polishing pads may still be used during the CMP process. Moreover, a system according to the principles of the present invention is employable in almost any CMP apparatus, while retaining benefits such as those described above.

Figure 3:
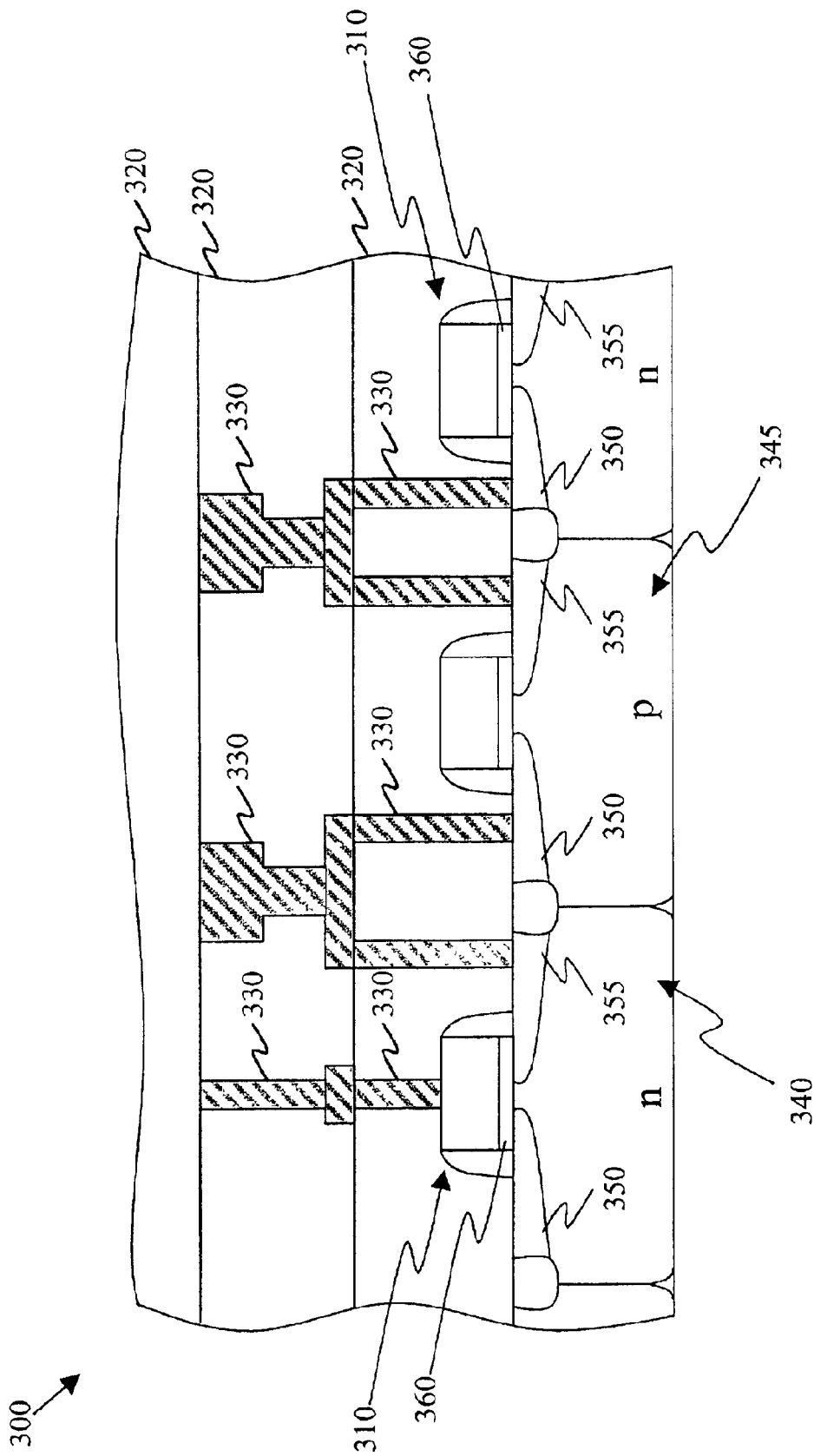
FIG. 3 illustrates a sectional view of a conventional integrated circuit (IC), which may be formed using the polishing endpoint detection system of the present invention.

Turning finally to FIG. 3, illustrated is a sectional view of a conventional integrated circuit (IC) 300, which may be formed using the polishing endpoint detection system of the present invention. The IC 300 may include active devices, such as transistors, used to form CMOS devices, BiCMOS devices, Bipolar devices, or other types of active devices. The IC 300 may further include passive devices such as inductors or resistors, or it may also include optical devices or optoelectronic devices. Those skilled in the art are familiar with these various types of device and their manufacture.

In the embodiment illustrated in FIG. 3, components of the conventional IC 300 include transistors 310, having gate oxide layers 360, formed on a semiconductor wafer. The transistors 310 may be metal-oxide semiconductor field effect transistors 310 (MOSFETs), however other types of transistors are within the scope of the present invention. Interlevel dielectric layers 320 are then shown deposited over the transistors 310.

The endpoint detection system of the present invention may be used to determine the thickness of any or all of the layers of the IC 300, including the interlevel dielectric layers 320 and metal layers from which interconnect structures 330 are formed, in accordance with the principles described above. The interconnect structures 330 are formed in the interlevel dielectric layers 320 to form interconnections between the various components therein to form an operative integrated circuit. In addition, the interconnect structures 330 also connect the transistors 310 to other areas or components of the IC 300. Those skilled in the art understand how to connect these various devices together to form an operative integrated circuit. Also illustrated are conventionally formed tubs 340, 345, source regions 350, and drain regions 355.

Of course, use of the endpoint detection system of the present invention is not limited to the manufacture of the particular IC 300 illustrated in FIG. 3. In fact, the present invention is broad enough to encompass the manufacture of any type of integrated circuit formed on a semiconductor wafer which would benefit from endpoint detection performed in accordance with the present invention. In addition, the present invention is broad enough to encompass integrated circuits having greater or fewer components than illustrated in the IC 300 of FIG. 3. Beneficially, each time the present invention is employed to form part or all of the IC 300, manufacturing costs may be eliminated from the entire manufacturing process, as discussed in detail above.

Although the present invention has been described in detail, those skilled in the art should understand that they can make various changes, substitutions and alterations herein without departing from the spirit and scope of the invention in its broadest form.

What is claimed is:

1. A method of determining a polishing endpoint of a surface located on a semiconductor wafer, comprising:
    emitting a first signal from an emitter located adjacent one of a carrier head or a polishing platen and causing said first signal to pass through a polished film located on a semiconductor wafer, and thereby provide a second signal having a signal intensity less than a signal intensity of said first signal;
    receiving said second signal emanating from said film with a receiver located on the side of said semiconductor wafer in opposition to said emitter, said receiver adjacent another of said carrier head or said polishing platen; and
    determining a polishing endpoint for said film as a function of a change of intensity between said first and second signals.

2. The method as recited in claim 1 wherein said emitting a first signal includes emitting a first signal from a signal emitter located adjacent said polishing platen and said receiving said second signal includes receiving said second signal with a signal receiver located adjacent said carrier head.

3. The method as recited in claim 1 wherein said emitting a first signal includes emitting a first signal comprised of acoustic waves having a plurality of frequencies and wherein said determining includes determining a polishing endpoint for said film as a function of a change of intensity of each of said plurality of acoustic waves between said first and second signals.

4. The method as recited in claim 1 wherein said determining includes determining a polishing endpoint for said film as a function of a change of a signal wavelength or a signal amplitude between said first and second signals.

5. The method as recited in claim 1 wherein said emitting a first signal includes emitting a first signal comprised of acoustic waves.

6. The method as recited in claim 5 wherein said emitting a first signal comprised of acoustic wavers includes emitting a first signal comprised of ultrasonic acoustic waves.

7. A method of determining a polishing endpoint of a surface located on a semiconductor wafer, comprising:
    emitting a first signal from a signal emitter located adjacent a carrier head and causing said first signal to pass through a polished film located on a semiconductor wafer, and thereby provide a second signal having a signal intensity less than a signal intensity of said first signal;
    receiving said second signal emanating from said film with a signal receiver located adjacent a polishing platen; and
    determining a polishing endpoint for said film as a function of a change of intensity between said first and second signals.

8. A method of manufacturing an integrated circuit, comprising:

forming an integrated circuit layer on a semiconductor wafer;

polishing said integrated circuit layer with a polishing apparatus having a carrier head and a polishing platen associated therewith;

determining a polishing endpoint of said integrated circuit layer, including:

emitting a first signal from an emitter located adjacent one of said carrier head or said polishing platen and causing said first signal to strike said integrated circuit layer, and thereby provide a second signal having a signal intensity less than a signal intensity of said first signal;

receiving said second signal emanating from said integrated circuit layer with a receiver located on the side of said semiconductor wafer in opposition to said emitter, said receiver adjacent another of said carrier head or said polishing platen; and determining said polishing endpoint as a function of a difference of intensity between said first and second signals.

9. The method as recited in claim 8 wherein said second signal is a resulting signal that results from said first signal striking said integrated circuit layer.

10. The method as recited in claim 8 wherein said emitting a first signal includes emitting a first signal from a signal emitter located adjacent said polishing platen and said receiving said second signal includes receiving said second signal with a signal receiver located adjacent said carrier head.

11. The method as recited in claim 8 wherein said emitting a first signal comprised of acoustic wavers includes emitting a first signal comprised of ultrasonic acoustic waves.

12. The method as recited in claim 8 wherein said emitting a first signal includes emitting a first signal comprised of acoustic waves having a plurality of frequencies and wherein said determining includes determining a polishing endpoint for said integrated circuit layer as a function of a change of intensity of each of said plurality of acoustic waves between said first and second signals.

13. The method as recited in claim 8 wherein said determining includes determining a polishing endpoint for said integrated circuit layer as a function of a change of a signal wavelength or a signal amplitude between said first and second signals.

14. A method of manufacturing an integrated circuit, comprising:

forming an integrated circuit layer on a semiconductor wafer;

polishing said integrated circuit layer with a polishing apparatus having a carrier head and a polishing platen associated therewith;

determining a polishing endpoint of said integrated circuit layer, including:

emitting a first signal from a signal emitter located adjacent a carrier head and causing said first signal to strike said integrated circuit layer, and thereby provide a second signal having a signal intensity less than a signal intensity of said first signal;

receiving said second signal emanating from said integrated circuit layer with a signal receiver located adjacent a polishing platen; and determining said polishing endpoint as a function of a difference of intensity between said first and second signals.

* * * * *